Figure 3:
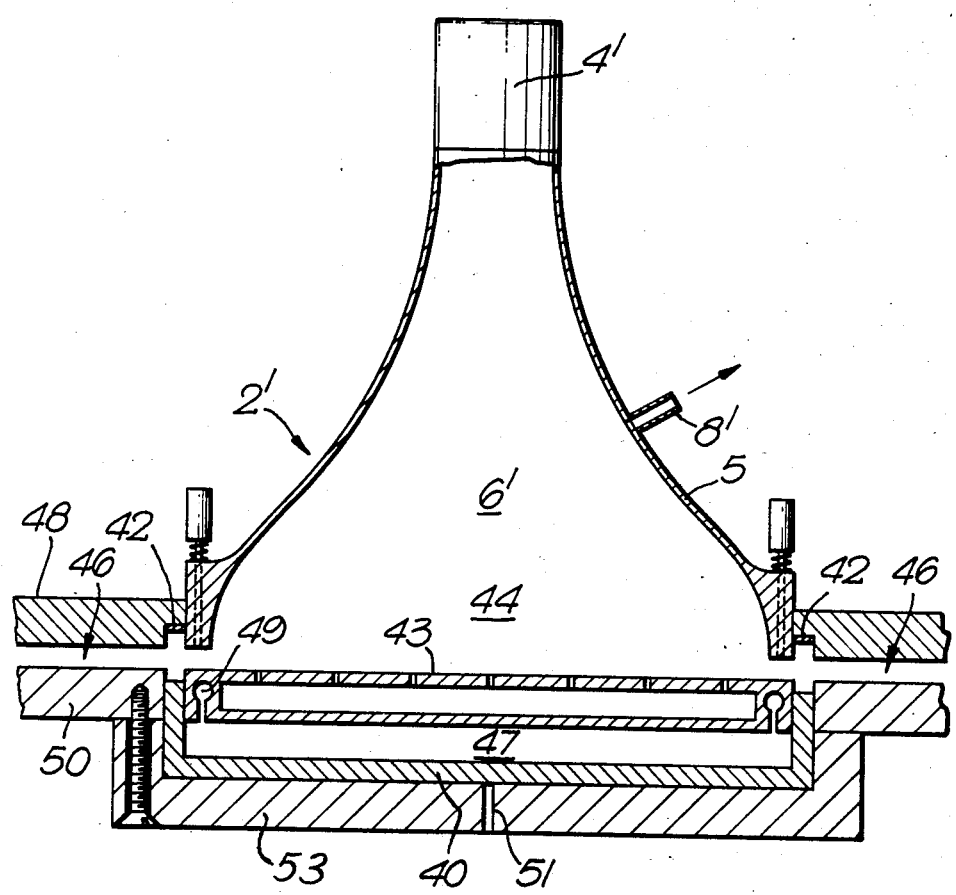

United States Patent [19]

Spence-Bate

[11] Patent Number: 4,697,194

[45] Date of Patent: Sep. 29, 1987

[54] LAMINA RECORDING APPARATUS

[75] Inventor: Harry A. H. Spence-Bate, Morley, Australia

[73] Assignee: Joyce Florence Spence-bate, Morley, Australia

[21] Appl. No.: 831,545

[22] Filed: Feb. 21, 1986

[30] Foreign Application Priority Data

Feb. 21, 1985 [AU] Australia .............................. PG9394

[51] Int. Cl.[4] ...................... G03B 27/32; G01D 15/28
[52] U.S. Cl. ................................. 346/110 V; 346/161;
355/20; 355/53; 355/76
[58] Field of Search ............... 346/110 V, 110 R, 161;
355/76, 53, 20

[56] References Cited

U.S. PATENT DOCUMENTS 3,504,371  3/1970  Reeds .............................. 346/110 V
4,176,947 12/1979  Spence-Bate ....................... 355/53
4,240,725 12/1980  Spence-Bate ........................ 354/3
4,455,563  6/1984  Tarnowski ...................... 346/110 V Primary Examiner—Joseph W. Hartary
Attorney, Agent, or Firm—Franklin D. Wolffe; Morris Fidelman

[57] ABSTRACT

A data recording device in which an emitter, normally an electron gun, is mounted within an evacuatable tube into which a sensitive recordable film may be introduced so that no part of the tube interposes between the emitter and the area of the film to be recorded. The film may be held on a grid in the tube or on a separate platen. The invention avoids the interposition of glass and coating material between the emitter and film and so can record with finer detail on the film. Also the device is very suitable for fast film handling by conveying the film on a gas stream into the tube and away.

4 Claims, 4 Drawing Figures

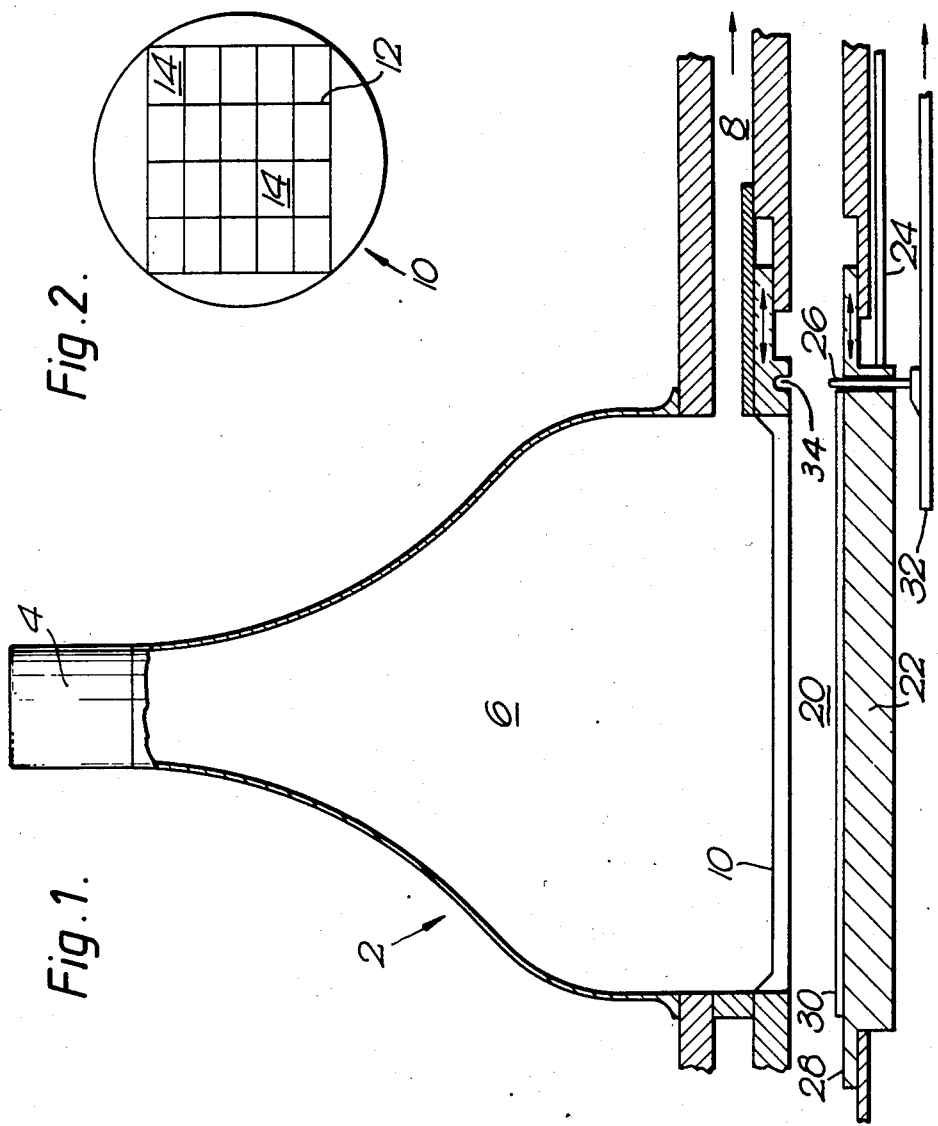

LAMINA RECORDING APPARATUS

The present invention relates to data recording.

Cathode ray tubes have been used to form an image which can then be recorded by photographic means. The resolution of a C.R.T. depends to a considerable extent on the grain of the illuminant used in the coating. Whilst the effect of the grain is insignificant when the images produced on the coating need no magnification, the granular size of the coating can be a limiting factor when microimages are being formed. This is especially so when microfiche and microfilm have to be recorded. If the coating can be completely dispensed with then greater resolution on an appropriate recording medium should be achievable.

It is an object of the present invention to provide an improved data recording device for recording data on a lamina.

A data recording device according to the invention comprises an emitter located in an evacuatable envelope, the emitter enabled to emit a data related emission to a recording station, means for holding a recordable film at the station, and means to evacuate the envelope.

Preferably the device is provided with means for introducing, and removing, the film into and from the envelope so that nothing is between the emitter and the film. In one preferred embodiment of the invention the film, normally a microfiche lamina is held firmly and precisely in the focal plane of the emitter, preferably an electron gun, by suction. When the suction is released the lamina is released and can easily be conveyed by such a convenient means as the gas cushion apparatus of my U.S. Pat. No. 4176947.

In another preferred embodiment a platen is provided which is movable relative the emitter to receive the film which is then held at the recording station within the envelope. The envelope can form a part of the gas cushion chamber of an apparatus such as in my U.S. Pat. No. 4176947.

Figure 4:
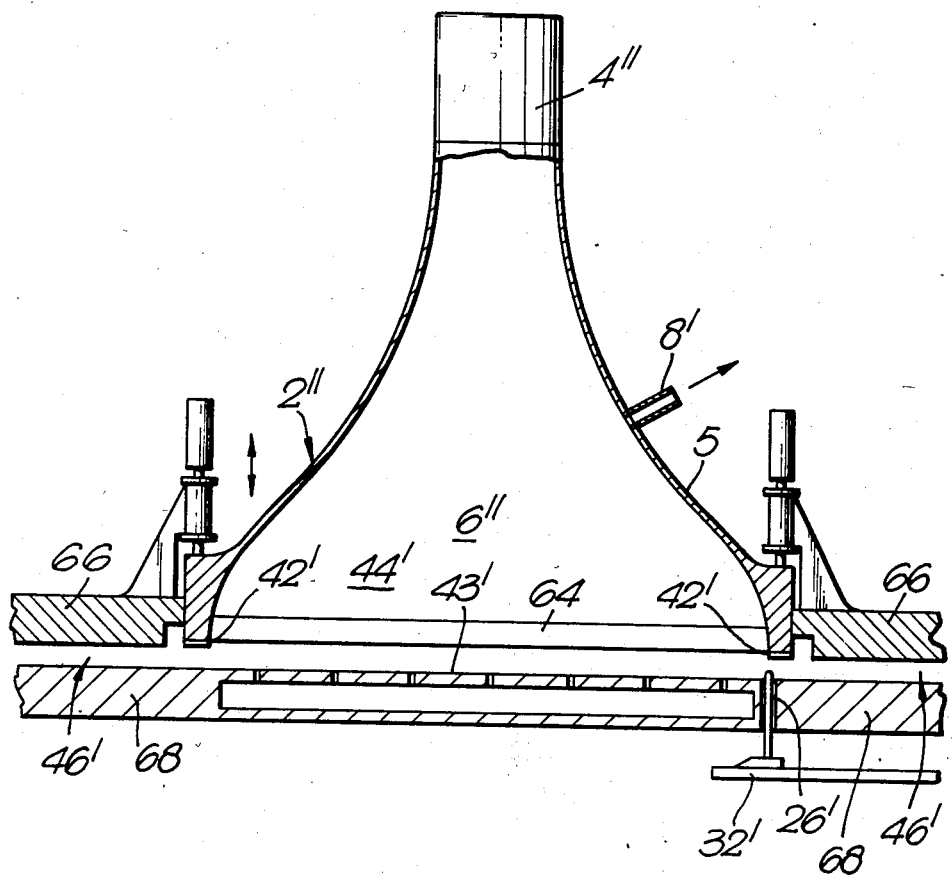

Embodiments of the invention will now be described by way of example with reference to the accompanying drawings in which:

FIG. 1 is a sectional side view of the device according to a first embodiment of the invention, FIG. 2 is a plan view of a face of a tube shown in FIG. 1, FIG. 3 is a sectional side view of a second embodiment, and FIG. 4 is a sectional side view of a third embodiment of the invention.

In FIG. 1 there is shown a modified cathode ray tube 2 having an emitter 4, which in this case is an electron gun, located in one end of an evacuatable envelope 6. Evacuation of the envelope is by means of a vacuum source connected to conduit 8.

In the focal plane of the emitter is a grid 10 which is optically flat. The grid as may be seen in FIG. 2 has cross bars 12 which provide open spaces 14 corresponding to the frames of one of the standards used for a microfiche. Emissions from the emitter can be directed directly with no material interposing onto the film.

The tube 2 is mounted at a station in a gas transport apparatus a simple version of which is shown in U.S. Pat. No. 4176947 so that laminae (normally microfiche) may be easily moved from one station to the station shown in FIG. 1 and in which can be seen (rather wider than is actual) the gas cushion space 20.

Below the tube 2 is a platen 22 which can be adjustable relative to tube 2 by means of a flexible drive or feed drive 24. Pins 26 on the platen can be made to project from surface 28 so as to locate the fiche 30. The pins 26 may be controlled by cam rods 32 or solenoids (not shown).

The platen 22 may be a pneumatic or electrostatic suction platen.

In order to calibrate the grid on the face 10 with the emitter the platen can be locked to the face by means of an indent 34 which can accept a pin 26. The interlocked platen and face are then moved by the drive 24.

Whilst an electron gun emitter is described above other types of emitter, e.g., an X-ray emitter may be used.

In a second embodiment of the invention as shown in FIG. 3, an emitter 4' or electron gun is provided at one end on a tube portion 5 which forms a part of an envelope 6'. The envelope 6' is further defined by a "U" shaped closure member 40 which is movable either side a film platen 43 to abut in a closed position on a seal 42. The space within the envelope 6' is in communication, when member 40 is open, with gas cushion chamber 46 of apparatus shown in FIG. 1 of that patent or plates 92, 93 shown in FIG. 8 of that patent. Space 47 below platen 43 is in communication via ducts 49 with a vacuum source so that, when vacuum is applied to space 47, atmospheric air at rough duct 51 in cover 53 acts on member 40 to close envelope 6'.

In FIG. 4, tube 6" with electron gun 4" is movable relative platen 62. A grid 64 similar to that shown in FIG. 1 holds the film onto platen 62. The envelope 6" is openable in a similar way to the FIG. 3 apparatus. Plates 66 and 68 are the upper and lower plates of the gas cushion apparatus similar to that shown in U.S. Pat. No. 4,176,947.

The present invention is particularly suited for incorporation in the gas cushion apparatus of U.S. Pat. No. 4,176,947 the subject matter of which is incorporated herein by reference.

It will be understood that variation and modifications can be effected within the spirit and scope of the invention as described hereinabove and as defined in the appended claims.

I claim:

1. In an apparatus for moving sheet material, said apparatus comprising two generally parallel plates spaced apart to define a chamber within which chamber said sheet material is supported on a cushion of gas and moveable in X and Y defineable directions generally parallel to said plates by currents of said gas, the improvement comprising:

a data recording station comprising:

emitter means for imparting data to a recordable sheet of film;

means for holding said film at said station;

a tube having opened and closed ends and means for drawing a vacuum, said emitter means being situated generally at said closed end, and said open end being communicable with said gas cushion chamber through an opening in at least one of said plates;

a platen spaced opposite of and across said gas cushion from said tube open end so as to present a platen surface over which said film is positioned for reception of said data; and closure means, structurally separate from said film, for sealingly isolating said tube and platen surface from said gas cushion so as to define an envelope evacuatable by said vacuum drawing means of said tube.

2. The improvement as in claim 1, wherein said closure means comprises:
means for shifting said tube through said chamber and into sealing engagement with said platen.

3. The improvement as in claim 1, wherein said closure means comprises:
a cover generally telescopic over said platen such that a skirt of said cover bridges a space between said parallel plates and comprises a portion of said envelope when closed.

4. The improvement of claim 1 and further comprising: a grid interposed between said emitter means and said station, and
said film holding means comprising said grid and a vacuum created within said envelope, whereby said vacuum holds said film to said grid.

* * * * *